United States Patent [19]

Clyde

[11] 3,998,758

[45] Dec. 21, 1976

[54] SUPPORTED CATALYST

[76] Inventor: Robert A. Clyde, Box 430820, South Miami, Fla. 33143

[22] Filed: Aug. 18, 1975

[21] Appl. No.: 605,677

Related U.S. Application Data

[63] Continuation-in-part of Ser. No. 334,261, Feb. 21, 1973, Pat. No. 3,900,646.

[52] U.S. Cl. .................... 252/466 J; 252/477 R; 428/305; 428/306; 428/312; 252/463; 252/473; 252/475; 252/465; 252/466 B; 252/467

[51] Int. Cl.$^2$ .................... B01J 21/04; B01J 23/74; B01J 35/04

[58] Field of Search ........... 252/466 J, 477 R, 463, 252/465, 466 B, 467, 473, 475; 106/40 R; 428/305, 306, 312

[56] References Cited

UNITED STATES PATENTS 3,839,225   10/1974   Acres ............................ 252/477 R Primary Examiner—W. J. Shine
Attorney, Agent, or Firm—Fred L. Denson

[57] ABSTRACT

A novel supported catalyst is described. The catalyst contains (a) a ceramic sponge support having internal surfaces comprised of the walls of cavities randomly dispersed throughout the sponge support and the walls of intersticial passageways connecting said cavities; (b) a first layer of either nickel, copper or cobalt substantially uniformly deposited on and adherent to all internal surfaces of the ceramic sponge support; (c) a second layer comprising a lattice network of either nickel, copper or cobalt adherent to and on the surface of said first layer; and (d) a sufficient quantity of either aluminum, magnesium or zinc intermittently dispersed throughout the second layer to retain the integral structure of said lattice network. The catalyst exhibits increased efficiency over prior art catalysts when used in similar capacities.

11 Claims, 4 Drawing Figures

SUPPORTED CATALYST

This application is a continuation-in-part of application 334,261, filed February 21, 1973 by Robert A. Clyde and now United States Patent No. 3,900,646.

BACKGROUND OF THE INVENTION

The invention described herein relates to novel supported catalysts.

DESCRIPTION OF THE PRIOR ART

There are several types of supporting structures used to facilitate contact between catalytic materials and fluids. Included among these supporting structures are honeycombs with parallel holes, sponges with random holes, pellets, saddles, plates, rings, etc. The supporting structures or substrates can be made from any one of several materials including metals, ceramics, synthetic materials, etc.

Honeycomb supports suffer from several disadvantages. In streamline flow, for example, the fluids to be admixed often pass straight through the parallel holes of the support without mixing with each other. Also, in streamline flow a thin, almost stationary film of fluid is formed next to the catalyst which prevents the fluid from contacting the catalyst. Another disadvantage is that when a hot spot develops or an exothermic reaction takes place, the heat cannot dissipate directly to the sidewall since it must first pass through the support material, which in many instances is an insulater. Uniformity of temperature promotes specificity whereas a hot spot can catalyze a reaction that is not desired. In certain instances, hot spots result in catalyst flaking and/or poisoning. Likewise, in an endothermic reaction such as reforming, heat cannot be efficiently supplied to a parallel hole honeycomb support. Heat transfer capabilities of catalytic supports are of considerable significance in most applications. For example, the catalytic converter in an automobile must be heated up quickly when the engine is first started because the catalyst is not efficient when cold, and this is the time when the engine exhaust causes the most pollution. U.S. Pat. No. 3,768,982 of Kitzner, issued Oct. 30, 1973 utilizes an electric heater in the middle of a parallel hole monolith to try to heat it. When the engine is running slowly, the low velocity of the exhaust gasses results in low Reynolds number and streamline flow.

Because of their low void space, most parallel hole mololiths are heavy (about 35 pounds per cubic foot). This adds to the amount of time required for heat up. When they are packed in a high tower, considerable pressure is placed upon the support plates.

Similar disadvantages are associated with pellets or saddles. Because of large pressure drops, large fans are frequently required to force the fluid through and results in low throughput. When used in an auto converter, the car vibrations frequently cause the pellets and saddles ro tub against each other and break thereby causing even greater pressure drop and loss in engine efficiency.

Pellets or saddles also transfer heat poorly, as illustrated in Example 13 of U.S. Pat. No. 3,900,646 since one pellet or saddle touches an adjacent pellet or saddle at one point only, thereby severely reducing heat transfer by conduction.

Attempts have been made to increase the area of catalyst exposure by vapor depositing the catalyst on a substrate. U.S. Pat. No. 3,075,494 describes vapor desposition of aluminum and nickel on porous ceramic articles. The catalytic area exposed, however, is not exceedingly large but only a replication of the ceramic substrate. Raney type catalysts have been known for several years on powders and are very popular because they increase the area and resultant efficiency of the catalyst. Up to now, no known method has been disclosed for applying a Raney type catalyst to a ceramic sponge. It is readily apparent that such a structure would be very desirable in that the total surface area of a ceramic sponge is extremely large and the area of a gram of Raney metal such as nickel powder is very large, and typically in the range of 80 to 100 square meters, which is several times larger than the area of other non-Raney catalysts.

OBJECTS OF THE INVENTION

It is an object of this invention to provide a catalyst structure which will efficiently mix fluids which flow through it.

It is a further object of this invention to provide a catalyst structure which will promote turbulent flow and inhibit streamline flow.

Still another object of this invention is to provide a catalyst structure having good heat transfer characteristics.

Another object is to provide a catalytic structure the surfaces of which remain film free when in use.

Still another object of this invention is to provide a catalyst structure which is light in weight.

Another object of this invention is to provide a catalyst structure which causes relatively low pressure drops when used in a catalyst bed.

A further object of this invention is to provide a catalyst having a relatively large surface area.

Another object of this invention is to provide metal plated ceramic sponges which are useful as catalysts, fuel cells, and in heat exchange systems.

SUMMARY OF THE INVENTION

These and other objects of the invention are accomplished with a catalyst disposed on the surfaces of a ceramic sponge support. The ceramic sponge support has an internal surface area comprised primarily of cavity walls and the walls of intersticial passageways between cavities. The catalyst is disposed on these surfaces in two layers. The first layer is comprised of either vapor deposited nickel, copper, or cobalt. Because it is vapor deposited, the layer is uniformly applied and strongly adherent to the catalyst surface. The second layer is comprised of a lattice network of either nickel, copper or cobalt which is adherent to the first layer. A sufficient quantity of either aluminum, magnesium or zinc is contained in the lattice network to ensure that the network retains its integral structure. The thickness of the first layer is from about 0.10 millimeters to about 0.30 millimeters and the thickness of the second layer is approximately the same as the thickness of the first layer. The catalyst of this invention has several advantages over other known conventional catalysts. Because the catalyst is uniformly deposited on all internal surfaces of the sponge support and also because the second layer of the catalyst is a lattice network, the catalyst has an extremely high surface area. The sponge structure of the support imparts turbulent flow to fluids passing therethrough thereby greatly improving the mixing of the individual reactants. Turbulent flow is desirable in most applications in that it protects against fluid film formation on the catalytic surface which would have a tendency to decrease the catalytic activity. Also, the many voids contained in the structure of the ceramic sponge support and the thin layers of catalyst, lend to the relatively light weight of the catalyst compared to pellets, saddles or honeycombs. The numerous cavities in the support also reduce the extent of undesirable pressure drops across beds in which the catalyst is ued while the numerous walls of the cavities enhance the heat transfer capabilities of the catalyst. Thus, when hot spot near the center of a catalyst bed develop during a reaction, the heat produced is rapidly transferred to the walls of the vessel containing the catalyst and reactants. Conversely, when it is necessary to supply heat to the bed, the catalyst transfers heat from the walls to the center of the bed in a very short period of time. Several other advantages resulting from the use of the novel catalyst of this invention are described below.

DETAILED DESCRIPTION OF THE INVENTION

Figure 1:
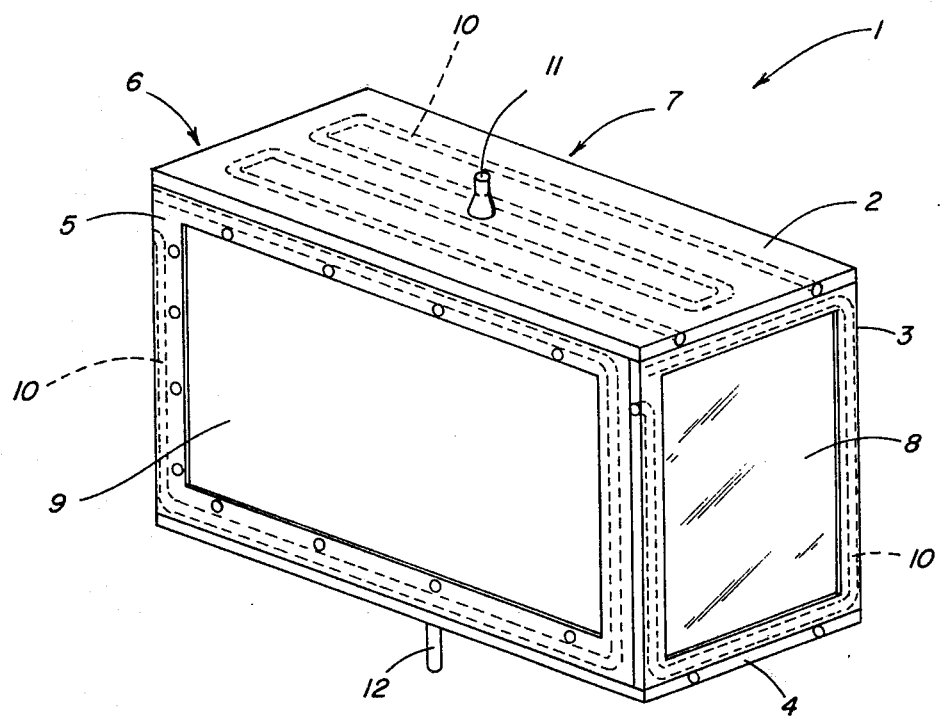
FIG. 1 illustrates the enclosure which may be employed in preparing the novel catalysts of this invention.

In preparing the novel catalysts of this invention, a catalytic metal such as nickel, copper or cobalt is vapor deposited onto the surfaces of a ceramic sponge support forming a first layer having a thickness from about 0.10 millimeters to about 0.30 millimeters. The preferred method and conditions for carrying out the plating process is desribed in U.S. Pat. No. 3,900,646 to Robert A. Clyde issued Aug. 19, 1975. After the first layer is applied to the substrate, a second layer is formed on the first layer by uniformly codepositing nickel, copper or cobalt with aluminum, magnesium or zinc. The codeposition is also carried out in the manner described in the aforementioned Clyde patent. The weight percentage of nickel, copper or cobalt contained in the second layer ranges from about 10% to 90% with the remainder being aluminum, magnesium or zinc. After the second layer is applied, the structure is heated in a gas such as hydrogen to a temperature from about 500° C to about 700° C for a period from about 25 minutes to 150 minutes or more. The heating step causes fusion of the codeposited metals contained in the second layer. Thereafter, a portion of the aluminum, magnesium or zinc is leached out by washing the structure with a suitable solution such as caustic for aluminum and zinc and acetic or propionic acid for magnesium. It is imperative that all of the aluminum, zinc or magnesium not be leached out but that a sufficient amount remain to maintain the integral structure of the lattice network of the second layer. When all of the aluminum, magnesium or zinc is leached out, the lattice structure collapses which significantly reduces the catalytic activity. The partial leaching enhances the activity of the catalyst in comparison to an unleached catalyst. When the catalyst of this invention becomes less active while in use, the catalyst can be regenerated simply by leaching out additional metal. However, even in the regeneration step, it is essential that some of the metal (i.e. aluminum, zinc or magnesium) remain. Research Bulletin No. 31 of the institute of Gas Technology (July, 1963) describes a method for partial leaching of aluminum.

Ceramic sponge production is described in U.S. Pat. No. 3,090,094 of schwartzwalder. Suitable ceramic sponges can be procured from Champion Spark Plug Co. These sponges weight about 20 pounds per cubic foot and contain from about 8 to about 50 holes per inch. The sponge structures can be made from virtually any ceramic material, for example borosilicates, soda-lime silicates, lead silicates, aluminum silicates such as mullite, magnesia, zircon, zirconia, petalite, spodumene, cordierite, corundum, glass ceramics, beryllium, silicon carbide, perovskite, etc.

As previously mentioned, a method for vapor depositing the various metals of this invention is described in U.S. Pat. No. 3,900,646 to Robert A. Clyde. The prior art is replete with the various compounds useful for vapor plating purposes. One may employ any of the known heat-decomposable gaseous metal carbonyls, chlorides, acetyl acetonates, or alkyls. Illustrative compounds are metal carbonyls such as nickel and copper carbonyl, metal nitroxyls, metal hydrides, metal alkyls such as magnesium diethyl and triisobutylaluminum, metal acetylacetonates such as copper and cobaltous acetylacetonate, etc. The decomposition temperature of the heat-decomposable gaseous metal compound controls the temperature to which the workpiece is brought. Accordingly, the metal bearing gas is passed into the enclosure when the temperature of the workpiece is at this temperature.

In order to increase the activity of the catalyst of this invention, it can be doped with lithium or lithium hydride or it can be promoted with any of the known promoting metals such as platinum, palladium, ruthenium, molybdenum, chromium, silver, rhenium, zirconium, rhodium, vanadium, osmium, iridium and the like.

Referring to the drawings, FIG. 1 shows an enclosure which can typically be employed in the vapor deposition of the metals on the sponge support. The apparatus of FIG. 1 comprises the overall assembly 1 having a top metal panel 2 and a bottom panel 4. Typically, the top and bottom panels are made of steel. Attached to the panels are cooling lines 10 which can be spot welded to the steel. The front panel 3 has a glass window 8 for observation purposes and additionally contains cooling tubes 10. The side panels 5 and 7 contain glass window panels 9. The apparatus further comprises gas inlet conduits 11 and gas outlet conduits 12.

Figure 2:
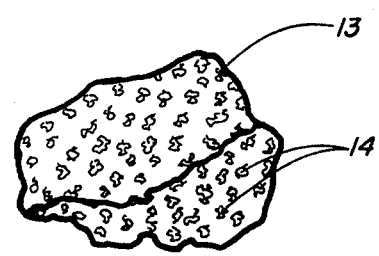
FIG. 2 is a perspective view of a ceramic sponge structure used to support the catalyst.
Figure 3:
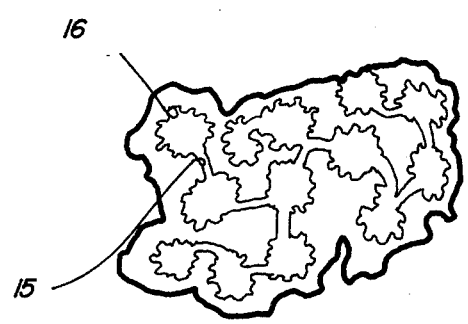
FIG. 3 is an exploded perspective view of a cutaway portion of the ceramic sponge of FIG. 2.

FIG. 2 represents a ceramic sponge support 13 having thousands of cavities or void spaces 14. FIG. 3 is an exploded view of a section of the interior of the ceramic sponge support of FIG. 2. The cavities within the sponge have walls 16 and the cavities are connected by intersticial passages which also have walls 15.

Figure 4:
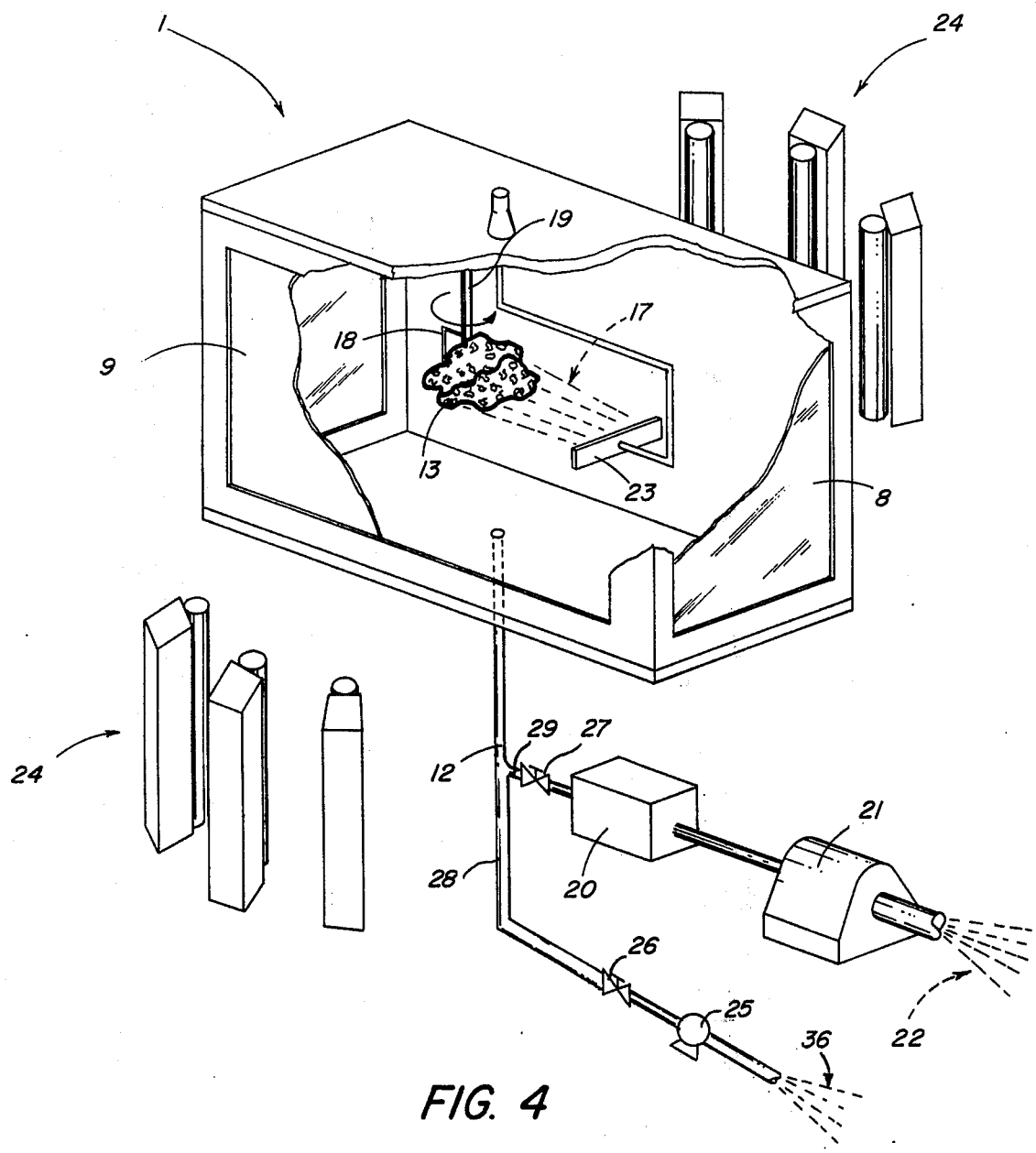
FIG. 4 illustrates the apparatus for the vapor deposition of the catalytic metallic layers contained on the internal surfaces of the ceramic sponge of FIG. 2.

FIG. 4 illustrates a typical plating method and operation. The ceramic sponge support to be coated is suspended from a suspension arm 18 which holds the workpiece. The suspension member 18 is on a rotating arm 19 thereby permitting the workpiece to be continuously rotated during the gas plating operation. The gas spray 17 enters the enclosure through a gas spraying device 23 while the workpiece 13 is continuously rotated. During the coating operation, the workpiece is radiantly heated by a bank of infrared tubes 24 located at the sides of the enclosure. The unused gas and carrier gases pass through the outlet tube 12 and line 29 through a trap 20, burning station 21 and finally exhaust through 22. A vacuum pump 25 can be used to evacuate chamber 1, the gases 30 passing through lines 12 and 28. Valves 27 and 26 are used to control the gas flow.

Generally, rotation about a single axis is sufficient. With respect to large workpieces or workpieces having odd shapes, various portions of the outside, for example, the top and bottom, may not be in line with the direct rays of the heating lamp and therefore not properly radiantly heated. The workpiece can then be alternatively rotated about an axis in the plane normal to the original axis of rotation or the workpiece can merely be alternatively angled so as to bring all portions of the piece into the direct ray of the lamp. With very large workpieces, it can be extremely difficult to rotate about 360° and hence it is desirable to oscillate the piece through an angle of about 30° in order to obtain uniform temperature across the piece.

The invention is further illustrated by reference to the following examples.

EXAMPLE 1

A 2×2×1 inch ceramic sponge support (Champion Spark Plug Co., Detroit, Mich.) is rotatably suspended in a chamber as shown in FIGS. 1 and 4. Vacuum is applied to the chamber three times, and after each application, the chamber is vented with nitrogen. The sponge is then rotated at 7 RPM and heated to 210° C by activating and deactivating infrared lights positioned around the outside of the chamber. Thereafter, nickel carbonyl vapor in a carbon monoxide carrier is introduced into the chamber. After 30 minutes, a 0.10mm layer of nickel is deposited uniformly on and throughout all of the internal walls of the support. Thereafter, the sponge is heated to 260° C and a mixture of triisobutyl aluminum and nickel carbonyl in a helium carrier gas carrier is introduced into the chamber. After 30 minutes a layer of aluminum and nickel is deposited on the first nickel layer, the heat is discontinued and the chamber is purged with nitrogen. Thereafter, the sponge is heated to 700° C for 25 minutes under hydrogen causing a portion of the aluminum to diffuse into the nickel lattice. The chamber is then cooled to 50° C and the sponge is leached with a 15% caustic soda solution by periodically reversing the flow of the solution. Most of the aluminum is dissolved out, however, a sufficient amount of aluminum remains to maintain the integral structure of the nickel lattice of the second layer. A highly efficient catalyst is obtained.

EXAMPLE 2

Example 1 is repeated except that copper acetylacetonate is used instead of nickel carbonyl. An excellent ceramic sponge supported catalyst is obtained having a first layer of copper and a second layer comprising a copper lattice having aluminum dispersed throughout the lattice network.

EXAMPLE 3

Example 1 is repeated except that cobaltous acetylacetonate is used instead of nickel carbonyl. Once again, an excellent ceramic sponge supported catalyst is obtained having a first layer of cobalt and a second layer comprising a cobalt lattice having aluminum dispersed throughout the lattice network.

EXAMPLE 4

Example 1 is repeated except that magnesium diphenyl is used instead of triisobutyl aluminum. After the magnesium has been codeposited with the nickel, most of the magnesium is leached out by using acetic acid. An excellent ceramic sponge supported catalyst is obtained having a first layer of nickel and a second layer comprising a nickel lattice having magnesium dispersed through the lattice network.

EXAMPLE 5

Example 1 is repeated except that leaching is continued until all of the aluminum is removed causing the lattice network to collapse. The resultant catalyst is not as efficient as the catalyst of Example 1 in that the collapse of the lattice network reduces the catalyst surface area.

EXAMPLE 6

Example 1 is repeated except that aluminum and nickel are not codeposited; instead an aluminum layer alone is deposited on the nickel layer. When the aluminum is leached out, aluminum hydroxide is formed which blocks the internal cavities and intersticial passageways thereby rendering the catalyst inefficient when put to use.

EXAMPLE 7

A ceramic honeycomb support catalyst having parallel holes is prepared in the same manner as the ceramic sponge supported catalyst of Example 1. The two catalysts are tested for efficiency by attaching each to the exhaust line of an idling gasoline engine and noting the reduction in the $NO_2$ content of the exhaust hot gases. One minute and 35 seconds is required for the honeycomb catalyst to reduce the $NO_2$ content to an acceptable level whereas 1 minute and 18 seconds is required for the sponge catalyst of this invention to reduce the $NO_2$ content to the same acceptable level. Because of the parallel holes in the honeycomb support, a fluid barrier film forms on the surface of the catalyst rendering it less effective than the sponge support, particularly when the honeycomb supported catalyst is used with fluids in a laminar flow state (i.e. Reynolds No. of less than about 2200).

EXAMPLE 8

A ceramic honeycomb supported catalyst is prepared in the same manner as the ceramic sponge supported catalyst of Example 1. The two catalysts (having the same volume) are tested for efficiency by noting the rate of heat transfer from an oil bath to the center of each supported catalyst. Both sponges were at 25° C at the start of the heating process. After 10 minutes of heating, the temperature at the center of the honeycomb catalyst was 29° C whereas the temperature at the center of the sponge catalyst was 32° C. The shorter heating time is advantageous since it is well known that the degree of catalytic activity in chemical reactions is directly proportionate to the catalyst temperature. This is especially useful in endothermic reactions such as reforming where heat must be added to the catalyst.

The sponges of this invention can be used in the methanation of coal gas, reforming, in automobile catalytic converters to reduce $NO_2$ or to oxidize CO or hydrocarbons, in electrodes in fuel cells and batteries, in packed or trickle columns, in production of hydrogen from hydrocarbons, in catalytic crackers, in production of ammonia, formaldehyde, acrylonitrile, phthalic anhydride, in hydrogenations and amination reactions and in removing $SO_2$ from coal or petroleum. A reducing metal can be used to reduce the $SO_2$ to $H_2S$ or an oxdizing metal such as vanadium can be used to convert $SO_2$ to $SO_3$. The $H_2S$ or $SO_3$ can then be removed in a column packed with the catalyst of this invention. The sponge can also be used to oxidize hydrocarbon exhaust vapors from printing or varnish plants and to recover heat for preheating incoming air for use in these plants. Silver coated sponges are useful in the air oxidation of ethylene to ethylene oxide and in thrust chambers for satellites. Chromium and cobalt decompose the jet fuel hydrazine.

The invention has been described in detail with particular reference to preferred embodiments thereof, but it will be understood that variations and modifications can be effected within the spirit and scope of the invention.

I claim:

1. A novel catalyst comprising:
   a. a ceramic sponge support having internal surfaces comprised of the walls of cavities randomly dispersed throughout the sponge support and the walls of intersticial passageways connecting said cavities;
   b. a first layer of either nickel, copper or cobalt substantially uniformly deposited on and adherent to all internal surfaces of the ceramic sponge support;
   c. a second layer comprising a lattice network of either nickel, copper or cobalt adherent to and on the surface of said first layer; and
   d. a sufficient quantity of either aluminum, magnesium or zinc intermittently dispersed throughout the second layer to retain the integral structure of said lattice network.

2. The catalyst of claim 1 wherein the thickness of the first layer is at least 0.10 millimeter.

3. The catalyst of claim 1 wherein the thickness of the second layer is approximately the same as the thickness of the first layer.

4. The catalyst of claim 1 wherein the first layer is nickel.

5. The catalyst of claim 1 wherein the first layer is copper.

6. The catalyst of claim 1 wherein the first layer is cobalt.

7. The catalyst of claim 1 wherein aluminum is intermittently dispersed throughout the second layer to retain the integral structure of the lattice network of the second layer.

8. The catalyst of claim 1 wherein magnesium is intermittently dispersed throughout the second layer to retain the integral structure of the lattice network of the second layer.

9. The catalyst of claim 1 wherein zinc is intermittently dispersed throughout the second layer to retain the integral structure of the lattice network of the second layer.

10. A novel catalyst comprising:
    a. a ceramic sponge support having internal surfaces comprised of the walls of cavities randomly dispersed throughout the sponge support and the walls of interstitial passageways connecting said cavities;
    b. a first layer of nickel substantially uniformly deposited on and adherent to all internal surfaces of the ceramic sponge support;
    c. a second layer comprising a lattice network of nickel adherent to and on the surface of said first layer; and
    d. a sufficient quantity of aluminum intermittently dispersed throughout the second layer to retain the integral structure of said nickel lattice network.

11. The catalyst of claim 1 including a promotion metal selected from the group consisting of platinum, palladium, ruthenium, molybdenum, chromium, silver, rhenium, zirconium, rhodium, vanadium, osmium and iridium to increase catalyst efficiency.

* * * * *